(12) United States Patent
Lee et al.

(10) Patent No.: US 6,985,229 B2
(45) Date of Patent: Jan. 10, 2006

(54) OVERLAY METROLOGY USING SCATTEROMETRY PROFILING

(75) Inventors: Cynthia C. Lee, Orlando, FL (US); Stephen Arlon Meisner, St. Cloud, FL (US); Thomas Michael Wolf, Orlando, FL (US); Alberto Santoni, Orlando, FL (US); John Martin McIntosh, Orlando, FL (US)

(73) Assignee: Agere Systems, Inc., Allentown, PA (US)

( * ) Notice: Subject to any disclaimer, the term of this patent is extended or adjusted under 35 U.S.C. 154(b) by 491 days.

(21) Appl. No.: 10/158,775

(22) Filed: May 30, 2002

(65) Prior Publication Data

US 2003/0223066 A1    Dec. 4, 2003

(51) Int. Cl.
*G01B 11/00*    (2006.01)
*G01R 31/26*    (2006.01)
*H01L 21/66*    (2006.01)

(52) U.S. Cl. ........................................ 356/401; 438/16
(58) Field of Classification Search ........ 356/400–401; 430/5, 22, 30; 250/548; 355/53, 55; 438/16
See application file for complete search history.

(56) References Cited

U.S. PATENT DOCUMENTS

| 4,631,416 A | * | 12/1986 | Trutna, Jr. ................... 356/400 |
| 4,728,193 A | | 3/1988 | Bartelt et al. |
| 4,757,207 A | * | 7/1988 | Chappelow et al. ........ 356/400 |
| 4,848,911 A | | 7/1989 | Uchida et al. |
| 5,343,292 A | | 8/1994 | Brueck et al. |
| 5,355,306 A | | 10/1994 | Waldo, III |
| 5,703,692 A | | 12/1997 | McNeil et al. |
| 5,808,742 A | * | 9/1998 | Everett et al. .............. 356/401 |
| 5,923,216 A | | 7/1999 | Pennock |
| 5,923,423 A | | 7/1999 | Sawatari et al. |
| 6,023,338 A | * | 2/2000 | Bareket ...................... 356/401 |
| 6,154,280 A | | 11/2000 | Borden |
| 6,710,876 B1 | * | 3/2004 | Nikoonahad et al. ....... 356/401 |
| 6,767,680 B2 | * | 7/2004 | Schulz ....................... 356/400 |
| 6,819,426 B2 | * | 11/2004 | Sezginer et al. ............ 356/401 |

FOREIGN PATENT DOCUMENTS

| EP | 323 242 A3 | 7/1989 |
| WO | WO 02/025723 A3 | 3/2002 |
| WO | WO 02/065545 A2 | 8/2002 |

\* cited by examiner

*Primary Examiner*—Layla G. Lauchman
*Assistant Examiner*—Gordon J. Stock, Jr.

(57) ABSTRACT

A method for nondestructively characterizing alignment overlay between two layers of a semiconductor wafer. An incident beam of radiation is directed upon the wafer surface and the properties of the resulting diffracted beam are determined, in one embodiment as a function of wavelength or incident angle. The spectrally or angularly resolved characteristics of the diffracted beam are related to the alignment of the overlay features. A library of calculated diffraction spectra is established by modeling a full range of expected variations in overlay alignment. The spectra resulting from the inspection of an actual wafer having alignment targets in at least two layers is compared against the library to identify a best fit to characterize the actual alignment. The results of the comparison may be used as an input for upstream and/or downstream process control.

2 Claims, 5 Drawing Sheets

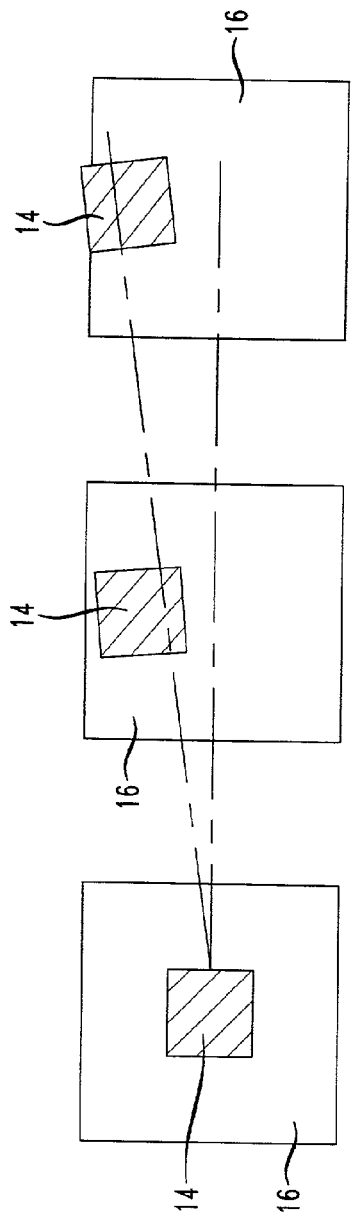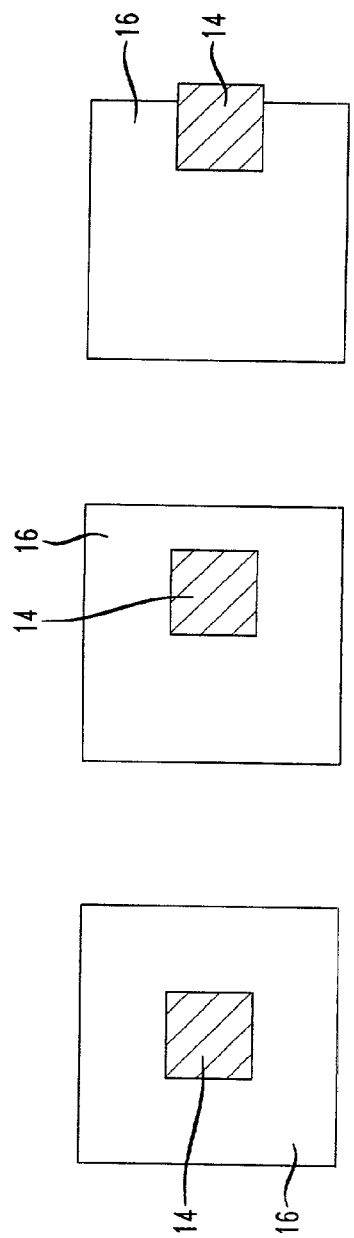

US 6,985,229 B2

OVERLAY METROLOGY USING SCATTEROMETRY PROFILING

FIELD OF THE INVENTION

The present invention relates generally to the field of metrology, and more particularly to overlay metrology using scatterometry profiling.

BACKGROUND OF THE INVENTION

Quality control for the production of microelectronic devices, such as integrated circuits formed on a semiconductor substrate wafer, depends upon the accurate alignment of each layer over the previously formed layers of the substrate. For example, each device formed on the semiconductor wafer must be properly aligned with respect to the other devices for the integrated circuit to operate properly. Further, each device region must be properly aligned with the other regions of the device for proper operation. Interconnect layers must be properly oriented with respect to underlying layers to ensure proper electrical connections are established. Thus vertical and horizontal alignment of the wafer layers and regions is of utmost importance to ensure successful operation of the integrated circuit. Misaligned layers will cause device regions to be displaced from their proper location, leading to device failure and thus failure of the integrated circuit.

During formation of the integrated circuit, the top wafer layer frequently undergoes a patterning and etching process to remove specific portions thereof. For example, metal layers are patterned and etched to form interconnects between device regions. Insulator layers are patterned and etched to form regions for deposition or implanting of dopants. As new layers are formed, the patterning and etching process is carried out on the top wafer layer. The patterning operation is performed using a mask having transparent and opaque regions for transferring a pattern from the mask to the top surface of the wafer. Conventionally, the mask pattern is first transferred to a layer of photoresist formed on the wafer surface. Photoresist is a light sensitive material such that light exposure changes the material structure and properties. For example, exposure of a negative-acting photoresist to light changes the photoresist from a soluble to an insoluble state, and the soluble regions can be removed with chemical solvents. When a negative-acting photoresist is applied to the top surface of a wafer and exposed to light through a mask, the exposed regions become insoluble. The soluble regions are then removed by chemical solvents. At this point the pattern has been transferred to the wafer surface for subsequent processing. For example, the exposed wafer surface regions can removed by a chemical etching process to which the photoresist is resistant, or dopant ions can be implanted in the exposed regions. After processing of the exposed regions has been completed, the remaining photoresist is removed. Thus it can be seen that the alignment between the mask and the underlying wafer surface must be precise to ensure accurate location of the removed regions relative to the regions previously formed in the wafer.

Semiconductor devices are formed in the integrated circuit by adding impurity dopants such as boron, phosphorus, and arsenic into a germanium or a silicon containing wafer layer to form the semiconductor regions. As is known, compound materials from columns III/IV and II/VI of the periodic table can also be used. Such a doped region may be a gate conductor or a source/drain region of a MOSFET device, for example. One doping process involves placing the wafer in a heated chamber and subjecting it to vapors of the proper dopant. Dopant atoms in the vapor diffuse into exposed regions of the wafer surface to form thin doped regions in the wafer surface. The exposed regions are defined by a previous masking step similar to the patterning and etching steps described above.

Alternatively, doped regions can be formed in the wafer by implantation of an impurity dopant species. The dopant may be introduced using an ion implantation process in which the wafer surface is exposed to bombardment by high energy dopant ions though a pattern of openings formed in a developed layer of the photoresist material. Conventionally, the pattern in the photoresist layer is formed by a photolithographic masking process as described above. The dopant ions penetrate the wafer surface to form implanted regions below the wafer surface, which remain after the layer of photoresist is removed.

Mask processing is also used for patterning metal interconnect layers. A layer of metal is applied to the wafer surface followed by a layer of photoresist. The photoresist is patterned using a masking process, exposed and then the photoresist and the underlying metal are etched. The remaining photoresist material is then removed, leaving a patterned metal layer of interconnect circuitry.

Multiple patterning steps using photolithographic masks as described above are commonplace in the fabrication of integrated circuits. For example, 15 to 20 masking steps may be required in the fabrication of a random access memory (RAM) integrated circuit (IC). The IC can contain tens of millions of individual devices in an area of about 0.25 square inches. Individual feature sizes are in the range of 1 micron and these features must be aligned to within tolerances of about one-third the feature size. This tolerance must be maintained as each level is exposed and formed in the wafer.

Typically, the masks used in the fabrication of an integrated circuit include an alignment mark or target located near the mask edge. Each wafer layer also includes an alignment mark or target. These targets can be formed of metal in metal layers or a doped region in a device layer. Mask alignment is then accomplished by properly positioning the mask target over a corresponding mark on the wafer. As illustrated in FIG. 1, alignment marks can include a cross 10 in the mask for aligning with four spaced apart squares 12 in the top wafer layer, such that the arms of the cross are located in the region between the squares. Another type of alignment mark includes two differently-sized squares that are aligned by placing the smaller square 14 in the middle of the larger square 16. See FIG. 2.

There are several categories of alignment errors. Simple displacement in the x-y direction is probably the most common. FIG. 3 illustrates misalignment in the x direction. In a rotational error condition, one side of the wafer is aligned, but the patterns become increasingly misaligned across the wafer. See FIG. 4. While certain semiconductor processes may utilize one mask to pattern and etch the entire wafer surface, it is more common for a mask to comprise a plurality of smaller masks for patterning and etching one more individual die on the wafer. If the mask patterns are not located on constant centers or are off-center, run-in and run-out alignment problems are created. As shown in FIG. 5, then only a portion of the mask patterns can be properly aligned to the wafer patterns and the pattern becomes progressively misaligned across the wafer.

FIG. 6 is a profile view of the misalignment between a wafer feature 20 and an underlying feature 22. Ideally, the feature 20 should be centered over the feature 22. Alignment error in FIG. 6 is indicated by an arrow 24.

There are several known devices and techniques for aligning the mask and wafer during the fabrication process. In the contact aligner, the wafer is mounted over a vacuum wafer chuck and located below the mask. The operator aligns the mask alignment marks with the marks on the wafer surface by viewing through a microscope and reorienting the wafer as required to bring the marks into alignment. Typically, the wafer and mask each include two sets of alignment marks on opposing sides. The microscope image presents a split field so that these opposing edges can be viewed simultaneously and the wafer adjusted until both sets of marks indicate alignment. Once aligned, the wafer is driven upward into contact with the mask and the wafer photoresist is exposed through the mask.

Modern alignment processes are built into the steppers/repeaters used in most state-of-the-art fabrication facilities. A reticle carrying the pattern of one or more wafer die is aligned with the wafer, the wafer is exposed, the reticle is stepped to the next site and the process is repeated. The result is better overlay and alignment as each die or a plurality of closely spaced dice are individually aligned. As a result, the stepping procedure allows precise alignment over larger diameter wafers. The stepper incorporates an automatic alignment system in which low energy laser beams are passed through alignment marks on the reticle and reflected from corresponding alignment marks on the wafer surface. The resulting signal is analyzed to determine the center of reflections, from which the relative offset is computed. The offset information is input to a computer controlled wafer chuck that moves the wafer relative to the mask until the offset is reduced below a predetermined threshold.

As semiconductor line widths and feature sizes continue to shrink, the disadvantages of state-of-the-art overlay metrology become more pronounced. Accuracy is limited by the overlay feature scale relative to the active area feature scale. The overlay features must be large enough to be optically resolvable by current techniques, but the overlay feature scale is often much larger than the circuit device features. Thus large non-design rule targets or overlay marks are required. In certain processes, accurate overlay is determined by edge detection algorithms, but the associated variability in defining these edges is a disadvantage of the present overlay metrology techniques. Also, the current techniques do not provide any feature profile information that can be useful in determining overlay accuracy.

Process distortions in the overlay marks also lead to misalignment. Because different regions of the optical lens system can be used to expose different areas of the wafer, the alignment across the wafer can be affected by localized lens distortion, focus and illumination conditions. These disadvantages become more prevalent as wave front engineering methodologies, such as phase shift masks become more common.

In conventional semiconductor processing the stepper/repeater performs the alignment and exposure function as the wafer is processed. However, a separate off-line step is used to characterize the overlay misalignment of the mask-printed feature to the underlying feature, i.e., how well did the stepper/repeater align the mask image on the photoresist relative to the wafer features. This overlay characterization is performed off-line with stand-alone optical microscopes, rather than with fabrication-integrated overlay metrology tools.

As is known, the accuracy of the optical overlay system is limited by the wavelength of the light. Particles or surface features smaller than the wavelength cannot be detected. Scanning electron microscopes are also limited in that the electrons do not penetrate the wafer surface and thus it is not possible to align a surface layer with another layer below the surface. However, a scattered beam is not wavelength limited and certain electromagnetic frequencies used in a scatterometry process can penetrate below the wafer surface. Scatterometry metrology is used to measure various wafer characteristics scanning an incident laser beam over the wafer surface. In one form of scatterometry a multiple wavelength beam (i.e., consisting of several frequencies) is incident on a fixed wafer. In another form, a single frequency incident beam is scattered from rotating a wafer. The reflected light is scattered from the surface onto a screen by the microroughness and surface features. A camera captures the screen image and inputs the image data to a microprocessor, where the image is analyzed to reconstruct the surface that produced the particular screen pattern. The scatterometry technique is used to measure grain sizes, contours and critical dimensions on the wafer surface.

U.S. Pat. No. 5,293,216 describes a sensor device for semiconductor manufacturing which operates on the principle of scatterometry. A coherent beam of laser energy is directed toward a semiconductor wafer surface. Coherent and scattered portions of the beam that are reflected by and transmitted through the wafer are measured and analyzed. This device is used to determine the surface roughness and spectral emissivity values of the wafer which is then correlated to a film thickness value.

Other U.S. patents describe other applications of scatterometer systems for measuring surface features on a semiconductor wafer. U.S. Pat. No. 5,923,423 describes a heterodyne scatterometer for detecting and analyzing wafer surface defects. U.S. Pat. No. 5,703,692 describes an optical scatterometer system that provides illumination of a sample at various angles of incidence without the need for rotating the sample. U.S. Pat. No. 6,154,280 describes a system for measuring surface roughness using two separate beams of electromagnetic radiation. Each of the above-described prior art patents are hereby incorporated by reference herein.

BRIEF SUMMARY OF THE INVENTION

There is a particular need for an overlay metrology process that provides an optical profile of a top level photoresist and its overlay relationship to all prior levels.

An exemplary method of determining accurate overlay between two layers of a semiconductor wafer uses electromagnetic energy scattered from a wafer surface and the underlying layers to develop a profile of the layers. The wafer surface proximate the alignment marks or targets is illuminated with an incident beam of electromagnetic energy. The electromagnetic energy diffracted from the semiconductor wafer is detected to obtain a spectrally-resolved diffraction profile, which is then compared to sample profiles. If the measured diffraction profile matches a sample profile, then the two layers have the same alignment as the matched sample profile.

The exemplary method according to the present invention may further include: establishing a library of diffraction profiles for a plurality of modeled target alignment and misalignment orientations, and comparing the diffraction profile of the electromagnetic energy diffracted from the semiconductor wafer to the diffraction profiles of the library to identify a best fit with one of the plurality of modeled alignment orientations. A process may be controlled in response to the results of the step of analyzing or in response to the alignment profile determined by the detector. The exemplary method may further include illuminating the surface of the semiconductor wafer with multi-frequency polarized electromagnetic energy, measuring the relative phase change and the relative amplitude change of the electromagnetic energy diffracted from the semiconductor wafer as a function of wavelength, and comparing the spectra of measured relative phase and amplitude changes to a calculated spectra of phase and amplitude changes for a design-basis alignment profile.

According to one embodiment of the invention, an apparatus for determining the overlay alignment of a semiconductor wafer includes an instrument for measuring spectrally-resolved diffraction characteristics associated with a surface region; a library of spectrally-resolved diffraction characteristics calculated for a plurality of surface region alignments; and a comparator for selecting one of the spectrally-resolved diffraction characteristics from the library as a best fit to spectrally-resolved diffraction characteristics measured by the instrument. The apparatus may further include a process control device responsive to an output of the comparator.

BRIEF DESCRIPTION OF THE DRAWINGS

The features and advantages of the present invention will become apparent from the following detailed description of the invention when read with the accompanying drawings in which like reference characters refer to the same parts throughout the different figures. The drawings are not necessarily to scale, emphasis instead being placed upon illustrating the principles of the invention.

FIGS. 3, 4 and 5 illustrate exemplary misalignment conditions.

DETAILED DESCRIPTION OF THE INVENTION

Figure 1:
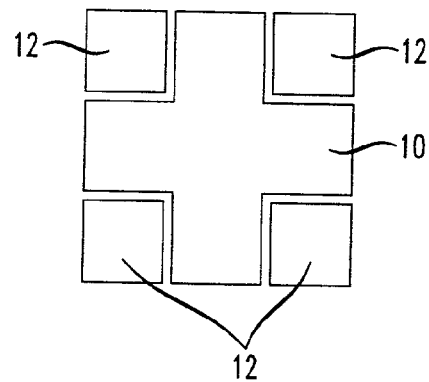
FIGS. 1 and 2 illustrate exemplary alignment marks for semiconductor overlay metrology.
Figure 2:
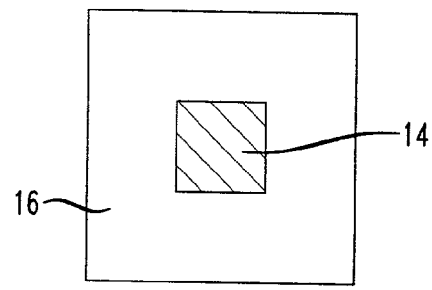
Figure 3:
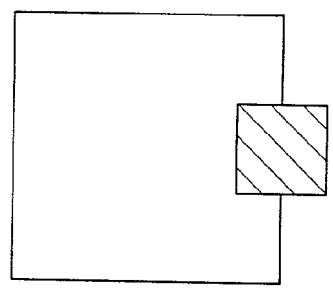
Figure 6:
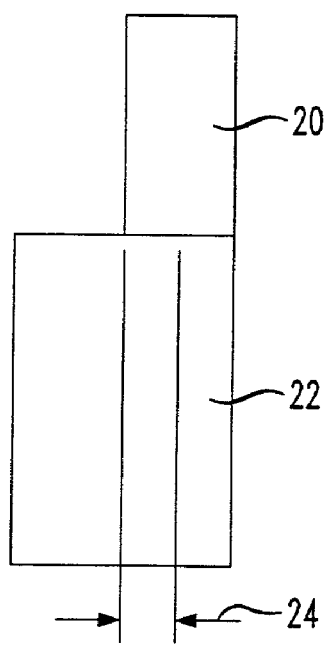
FIG. 6 is a profile view of misalignment between two wafer features.

Before describing in detail the particular method and apparatus in accordance with the present invention, it should be observed that numerous embodiments of the invention include a combination of hardware elements and method steps related to the use of scatterometry metrology for determining overlay alignment between wafer layers. Exemplary hardware elements and software steps have been represented by conventional elements in the drawings, showing only those specific details that are pertinent to the present invention, so as not to obscure the disclosure with structural details that will be readily apparent to those skilled in the art having the benefit of the description herein.

The principles of scatterometry metrology may be used for determining overlay alignment between two layers of a semiconductor wafer structure, for example, between a photoresist mask and an underlying layer that is to be patterned and etched according to the mask pattern. Conventional scatterometry metrology provides surface feature information, including the pitch between equally spaced surface features, the distance between features, feature size and the feature contour. According to the teachings of the present invention, the layers to be aligned may include alignment grating marks and thus the signal scattered from the wafer includes regions of constructive and destructive interference (i.e., a diffraction pattern) that is analyzed to determine the characteristics of the surface and underlying layers from which the beam was scattered, including the alignment of the grating marks and the vertical distance between the grating marks. The scatterometry process employs laser or coherent light incident on the wafer over a range of angles, each incident angle providing a scattering pattern at the detector. Alternatively, the process employs multi-frequency light, such as white light, incident at a single angle.

Another feature of the invention is that scattered energy is not dependent on the relationship between the wavelength of the incident light and the pitch or width of the overlay targets. Thus, targets can be formed with dimensions as small as required by process design rules to determine alignment between any two device features. Such use of scatterometry for overlay metrology allows the determination of overlay alignment based on smaller alignment features, this resulting in more accurate alignment than has been achievable with conventional optical techniques.

Figure 7:
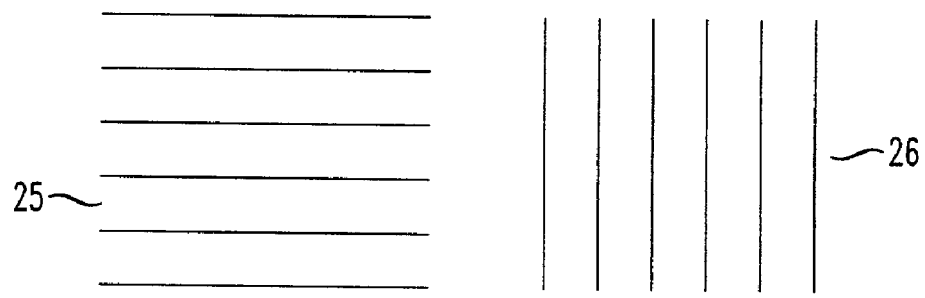
FIG. 7 illustrates exemplary gratings for use according to the teachings of the present invention.

Exemplary alignment grating targets are illustrated in FIG. 7. A plurality of side-to-side lines 25 are formed in a wafer surface layer (a photoresist layer, for example) and a plurality of top-to-bottom lines 26 are formed in the underlaying layer. Using these two sets of perpendicular grating lines provides overlay alignment in both the x and y directions. In addition to forming these grating lines at the edges of a wafer, they can be formed in an individual wafer die to ensure overlay alignment for each die. Alignment using multiple targets throughout the wafer also reduces the run-in, run-out and rotational error problems.

Figure 8:
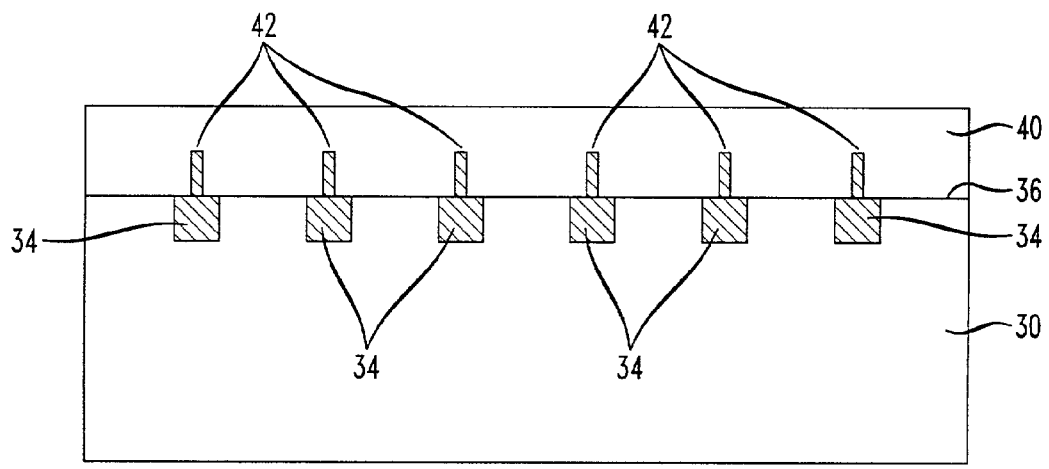
FIG. 8 illustrates a wafer surface and an overlaying layer to which the teachings of the present invention can be applied.

An exemplary embodiment of the invention is now described beginning with the view of FIG. 8. A work piece such as semiconductor wafer 30 incorporates a periodic pattern of target features 34 that can be used for determining overlay alignment. The target features 34 comprise, for example, doped regions, silicon dioxide, or polysilicon, metal lines, trenches or rows of vias, formed below a top surface 36. Typically, the target features 34 are formed to serve as an overlay grating pattern, rather than serving as active features of the device. However, there is nothing within the scope of the present invention that precludes the use of active device regions for overlay alignment, so long as the active regions have a known intra-feature distance. An overlying mask 40 includes a plurality of grating lines 42 for alignment with the target features 34. To provide alignment in both the x and the y directions, the target features 34 must be oriented with respect to each other at a known angle, such as the perpendicular lines 26 and 27 illustrated in FIG. 7. The overlay alignment between the target features 34 and the grating lines 42 is characterized and compared with possible misalignment conditions, as described more fully below, such that the degree and nature of the misaligned condition generates a feedback signal input to the alignment tool for use in moving the wafer to bring the grating lines 42 and the target features 34 into alignment.

Figure 9:
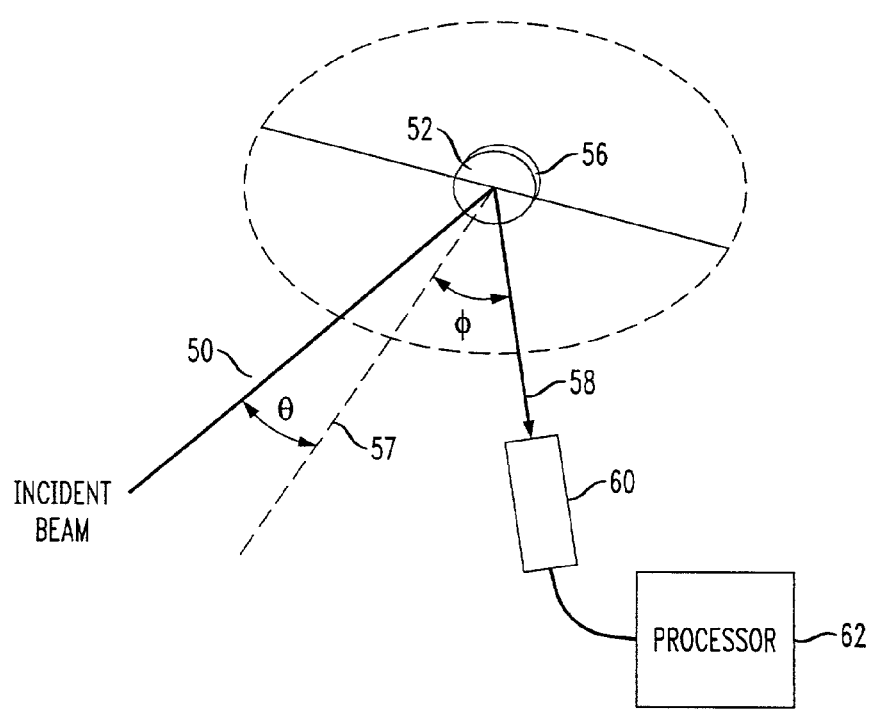
FIG. 9 illustrates a simplified, functional diagram of a scatterometer system for use in conjunction with the present invention.

As illustrated in FIG. 9, incident radiation such as an incident beam of polarized electromagnetic energy 50, is directed toward the substrate top surface 52 of a wafer 56 at an angle of incidence θ relative to normal line 57. The incident beam 50 may be coherent laser energy or non-coherent energy of single or multiple wavelengths. The energy of the incident beam 50 interacts with the wafer 56 to produce a diffracted or scattered beam of electromagnetic energy 58, leaving the wafer 56 at an angle φ relative to line 57. The angle φ is a function of angle θ and wavelength of the incident light. The diffracted beam or diffracted radiation as referenced herein is understood to include all electromagnetic energy resulting from the variety of interactions between the incident beam and the wafer 56, including reflection (i.e., specular coherent reflection), scattering (i.e., non-specular incoherent reflection), bending, and absorption components. At each layer interface of the wafer 56, energy may be both transmitted and reflected according to the angle of incidence and the difference in the index of refraction of the materials. Thus as the electromagnetic energy passes through the material of the wafer 56 it may be partially absorbed and its direction of travel changed.

The resulting diffracted beam 58 is a function of the properties of the incident beam 50, the angle of incidence, and the properties of the wafer 56, including the alignment between the grating lines 42 and the target features 34 present on the surface or in the underlying regions of the wafer 56. If there is alignment between the overlay targets, then a symmetrical diffraction pattern will be produced as the incident beam is scanned from one side to the other side of the wafer 56. Asymmetry in the diffraction pattern indicates that the targets are not aligned. The diffracted beam 58 is input to a detector 60 and a signal representative of the diffracted beam 58 is provided by the detector 60 to a processor 62 for analysis as discussed further below.

A typical wavelength for the incident beam 50 is about 200–1500 nanometers. The energy must not be strongly absorbed as it passes through the wafer layers and further the wavelength should advantageously be about the same order of magnitude as the feature sizes of the material to produce a diffracted beam from which the overlay information can be extracted.

The incident beam 50 can be emitted from a multiple frequency source (e.g., white light) or from multiple single frequency sources (e.g., a plurality of laser beams). The frequency of the incident beam 50 can also be swept over a range of frequencies. To scan the incident beam 50 across the wafer 56, any one or more of the beam source, the wafer 56 or the detector 60 can be rotated.

Figure 10:
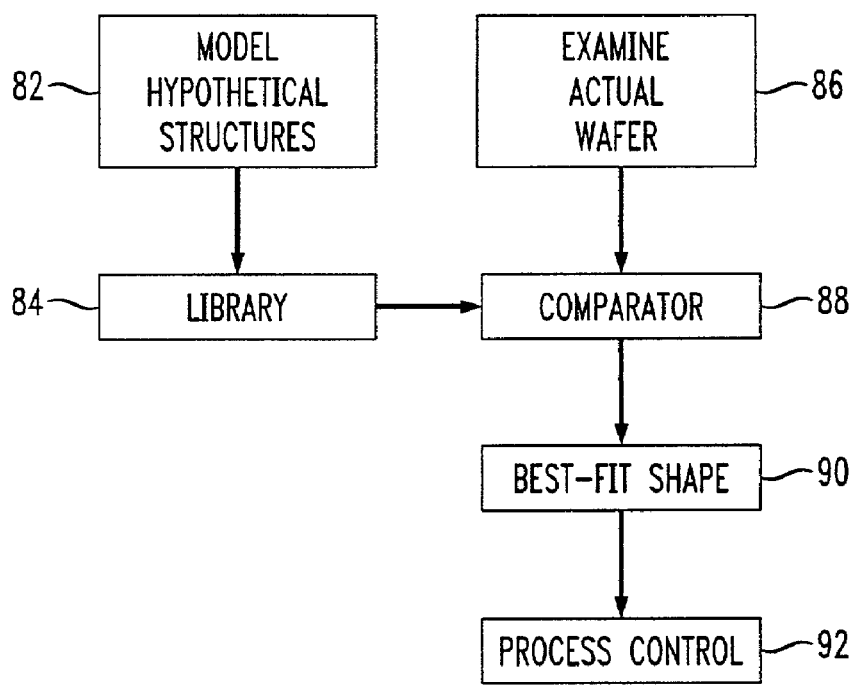
FIG. 10 illustrates a system and method for determining overlay alignment according to the present invention.

Software programs are commercially available for analyzing the diffraction properties of a sample, such as the wafer 56. One such program is available from KLA-Tencor Corporation of San Jose, Calif. Such programs may be used in a process 80, see FIG. 10, for determining overlay between at least two layers in the wafer 56. The analysis program is first used at a step 82 to model the properties of the diffracted beam 58 for an alignment condition between two layers of hypothetical wafers. The step 82 is repeated for any number of possible alignment and misalignment conditions that can exist between the two layers, and the modeling results stored in a library 84. The library 84 may include as many as 100,000 or even a million or more of such results, for example.

The alignment of the targets of the wafer 56 is then examined at a step 86 using the instrumentation of FIG. 9 to provide a characterization of the alignment in terms of the spectral characteristics of the diffracted beam from the wafer. The spectral characteristics are processed to determine the alignment overlay of the actual wafer. Circuitry for processing the spectral characteristics to determine the structural characterization may include, for example, a comparator 88. The comparator 88 is used to compare the modeled results stored in the library 84 with the spectral characteristics determined at the step 86. The comparator 88 may be a computerized data processing device implementing a best-fit analysis or other known numerical processing techniques. The best-fitting of the modeled spectra is selected at step 90 as being representative of the actual alignment of the target marks in the wafer 56, and may further be used for controlling a downstream and/or upstream process control device 92. The acceptability of the overlay alignment of the wafer 56 is demonstrated if the actual alignment is within a defined tolerance range of the design-basis alignment. If the alignment is outside the acceptable tolerance, process variables may be changed in response thereto for an overlay process device such as a stepper/repeater to return the process to design-basis conditions.

While the preferred embodiments of the present invention have been shown and described herein, it will be obvious that such embodiments are provided by way of example only. Numerous variations, changes and substitutions will occur to those of skill in the art without departing from the invention herein. For example, the application of the forgoing concepts need not be limited to a comparative function. Accordingly, it is intended that the invention be limited only by the spirit and scope of the appended claims.

What is claimed is:

1. A method for use in semiconductor manufacturing, the method comprising:
    illuminating a semiconductor wafer with an incident beam of electromagnetic energy, wherein the semiconductor wafer has at least two layers with overlay alignment features in each layer,
    determining characteristics of the electromagnetic energy diffracted from the semiconductor wafer; and
    determining an overlay alignment between the at least two layers from the characteristics; wherein the step of determining characteristics further comprises at least one of determining a phase change and an amplitude change as a function of the angle between the incident beam and a plane of the semiconductor wafer of the diffracted electromagnetic energy as compared to the incident electromagnetic energy.

2. A method for use in manufacturing, the method comprising:
    illuminating with electromagnetic radiation a workpiece having at least two features, one overlaying the other;
    obtaining spectrally-resolved characteristics of the radiation diffracted from the workpiece;
    analyzing the characteristics to characterize the relative alignment of the two features;
    illuminating a semiconductor wafer with an incident beam of electromagnetic energy, wherein the semiconductor wafer has at least two layers with overlay alignment features in each layer;
    determining characteristics of the electromagnetic energy diffracted from the semiconductor water; and
    determining the overlay alignment between the at least two layers from the characteristics wherein the step of determining the overlay alignment further comprises determining the vertical distance between the at least two layers.

* * * * *